(12) United States Patent
Yamazaki et al.

(10) Patent No.: US 6,995,417 B2
(45) Date of Patent: Feb. 7, 2006

(54) SEMICONDUCTOR DEVICE HAVING FERROELECTRIC CAPACITORS

(75) Inventors: Soichi Yamazaki, Yokohama (JP); Koji Yamakawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/924,854

(22) Filed: Aug. 25, 2004

(65) Prior Publication Data

US 2005/0258497 A1 Nov. 24, 2005

(30) Foreign Application Priority Data

May 18, 2004 (JP) .............................. 2004-147725

(51) Int. Cl.
*H01L 27/108* (2006.01)

(52) U.S. Cl. .................... 257/296; 257/306; 257/308

(58) Field of Classification Search ............... 257/296, 257/303, 306–309
See application file for complete search history.

(56) References Cited

U.S. PATENT DOCUMENTS

| 6,576,546 | B2 | 6/2003 | Gilbert et al. | 438/629 |
| 6,635,528 | B2 | 10/2003 | Gilbert et al. | 438/253 |
| 6,828,161 | B2 | 12/2004 | Summerfelt et al. | 438/3 |
| 6,841,396 | B2 | 1/2005 | Celii et al. | 438/3 |
| 6,876,021 | B2 | 4/2005 | Martin et al. | 257/295 |
| 2004/0053465 | A1 | 3/2004 | Hong | 438/253 |

FOREIGN PATENT DOCUMENTS

| JP | 11-54718 | 2/1999 |
| JP | 2003-68993 | 3/2003 |

*Primary Examiner*—T. N. Quach
(74) *Attorney, Agent, or Firm*—Oblon, Spivak, McClelland, Maier & Neustadt, P.C.

(57) ABSTRACT

Disclosed is a semiconductor device comprising a semiconductor substrate, an insulating region provided on the semiconductor substrate, a first capacitor provided above the insulating region, a second capacitor provided above the insulating region and adjacent to the first capacitor, a conductive hydrogen-barrier film which prevents diffusion of hydrogen into the first and second capacitors and connects a bottom electrode of the first capacitor with a bottom electrode of the second capacitor, the conductive hydrogen-barrier film having a first portion interposing between the insulating region and the first capacitor and between the insulating region and the second capacitor.

16 Claims, 2 Drawing Sheets

SEMICONDUCTOR DEVICE HAVING FERROELECTRIC CAPACITORS

CROSS-REFERENCE TO RELATED APPLICATIONS

This application is based upon and claims the benefit of priority from prior Japanese Patent Application No. 2004-147725, filed May 18, 2004, the entire contents of which are incorporated herein by reference.

BACKGROUND OF THE INVENTION

1. Field of the Invention

This invention relates to a semiconductor device having a capacitor.

2. Description of the Related Art

Recently, ferroelectric memories in which a ferroelectric film is used as a dielectric film of a capacitor, that is, FeRAMs (Ferroelectric Random Access Memory) have been developed.

In manufacture of ferroelectric capacitors, various processing in a reducing atmosphere is performed, such as processing a capacitor by RIE (reactive ion etching), deposition of an interlayer insulating film by CVD (chemical vapor deposition), and formation of a contact hole by RIE. Therefore, to prevent reduction of the capacitor insulating film (dielectric film), it is important to prevent diffusion of hydrogen contained in the reducing atmosphere into the capacitor.

Therefore, adopted is a method in which a capacitor is covered with hydrogen-barrier films to prevent diffusion of hydrogen into the capacitor. For example, in Jpn. Pat. Appln. KOKAI Pub. No. 11-54718, a hydrogen-barrier film such as a TiAlN is provided directly under a bottom electrode of a capacitor, and a top surface and side surfaces of the capacitor are covered with a hydrogen-barrier film, such as an aluminum oxide. Thereby, each capacitor is individually covered with hydrogen-barrier films.

However, Jpn. Pat. Appln. KOKAI Pub. No. 11-54718 only proposes a measure to prevent diffusion with respect to individual-capacitors. In a ferroelectric memory, there are cases where two capacitors which are related in circuitry are arranged adjacent to each other. In such cases, it is difficult to obtain an optimum structure even by using the above prior art. It is an important object how to realize an optimum structure having a function of preventing diffusion of hydrogen with respect to two adjacent capacitors.

BRIEF SUMMARY OF THE INVENTION

According to an aspect of the present invention, there is provided a semiconductor device comprising: a semiconductor substrate; an insulating region provided on the semiconductor substrate; a first capacitor provided above the insulating region; a second capacitor provided above the insulating region and adjacent to the first capacitor; a conductive hydrogen-barrier film which prevents diffusion of hydrogen into the first and second capacitors and connects a bottom electrode of the first capacitor with a bottom electrode of the second capacitor, the conductive hydrogen-barrier film having a first portion interposing between the insulating region and the first capacitor and between the insulating region and the second capacitor.

DETAILED DESCRIPTION OF THE INVENTION

Figure 1:
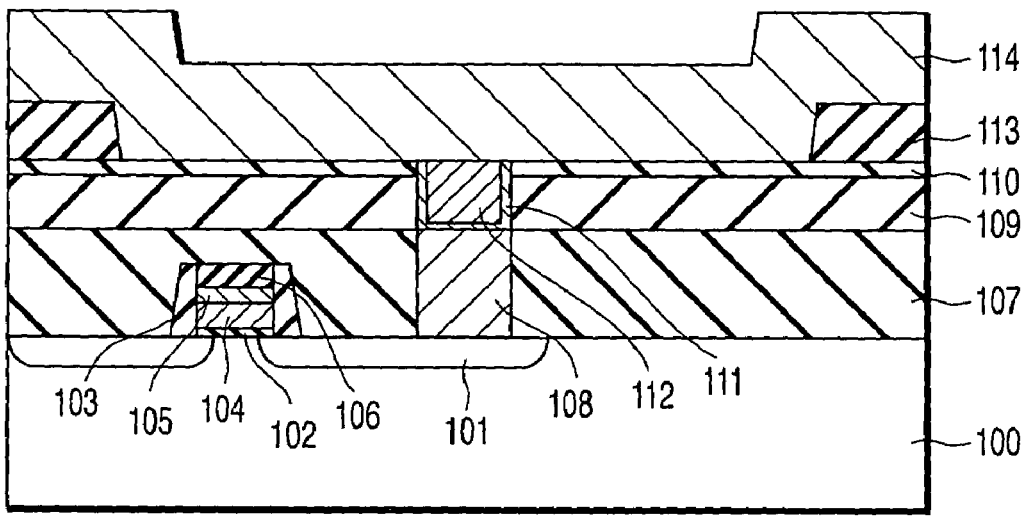
FIG. 1 is a schematic cross-sectional view of a manufacturing step of a semiconductor device according to an embodiment of the present invention.

An embodiment of the present invention is explained below with reference to drawings. FIGS. 1 to 4 are schematic cross-sectional views of manufacturing steps of a semiconductor device according to the embodiment of the present invention.

First, a structure of a semiconductor device (ferroelectric memory) according to the embodiment of the present invention is explained with reference to FIG. 4.

An isolating region (not shown) and a MIS transistor 10 are formed in a surface region of a p type silicon substrate (semiconductor substrate) 100. The MIS transistor 10 comprises a gate insulating film 102, a gate electrode (word line) formed of a polysilicon film 104 and a tungsten silicide film 105, a gate cap film 106, gate side wall films 103, and source/drain diffusion layers 101.

On the silicon substrate 100, formed is an insulating region 20 which includes an interlayer insulating film 107, a polysilicon plug 108, an interlayer insulating film 109, an interlayer insulating film 110, a barrier metal film 111 and a tungsten (W) plug 112. Specifically, the MIS transistor 10 is covered with the interlayer insulating film 107, and the polysilicon plug 108 connected to one of the source/drain diffusion layers 101 is formed in a contact hole which pierces the interlayer insulating film 107. The interlayer insulating films 109 and 110 are formed on the interlayer insulating film 107. The barrier metal film 111 and the tungsten plug 112 are formed in a contact hole piercing the interlayer insulating films 109 and 110.

An interlayer insulating film 113 is formed on the interlayer insulating film 110. The interlayer insulating film 113 is provided with a groove which is filled with a conductive hydrogen-barrier film 114. The conductive hydrogen-barrier film 114 prevents diffusion of hydrogen into capacitors 31 and 32, and has a higher barrier ability against hydrogen than that of silicon oxide films used as the interlayer insulating films and the like. A film containing titanium, aluminum and nitrogen (a TiAlN film) is used as the conductive hydrogen-barrier film 114. The conductive hydrogen-barrier film 114 also functions as wire (interconnect), and connects a bottom electrode 115 of the capacitor 31 with a bottom electrode 115 of the capacitor 32. Further, the conductive hydrogen-barrier film 114 is electrically connected to one of the source/drain diffusion layers 101 via the tungsten plug 112 and the polysilicon plug 108. The conductive hydrogen-barrier film 114 also has an oxygen-barrier ability to prevent diffusion of oxygen, and thereby can prevent oxidation of the tungsten plug 112.

On the conductive hydrogen-barrier film 114, a bottom electrode 115, a dielectric film 116, and a top electrode 117 of each capacitor are successively formed. Ferroelectric capacitors (capacitors 31 and 32) are formed by the respective bottom electrodes 115, the respective dielectric films 116, and the respective top electrodes 117. As each bottom electrode 115, used is a stacked film formed by successively stacking an Ir film, $IrO_2$ film, Pt film, Ti film and $SrRuO_3$ film (SRO film). A $Pb(Zr_xTi_{1-x})O_3$ film (PZT film) is used as each dielectric film 116. A stacked film formed by successively stacking an SRO film and a Pt film is used as each top electrode 117.

An aluminum oxide ($Al_2O_3$: Alumina) film 118 and a silicon oxide film (TEOS film) 119 are formed on each of the top electrodes 117 of the capacitors 31 and 32. The aluminum oxide films 118 and the silicon oxide films 119 are used as mask, when the top electrodes (top electrode film) 117, the dielectric films (dielectric film) 116 and the bottom electrodes (bottom electrode film) 115 are processed by RIE.

When the top electrodes (top electrode film) 117, the dielectric films (dielectric film) 116 and the bottom electrodes (bottom electrode film) 115 are etched by RIE, an exposed part of the conductive hydrogen-barrier film 114 is also etched to a certain extent. As a result, in the conductive hydrogen-barrier film 114, a portion (second portion) which interposes neither between the insulating region 20 and the capacitor 31 nor between the insulating region 20 and the capacitor 32 is thinner than that of a portion (first portion) which interposes between the insulating region 20 and the capacitor 31 and between the insulating region 20 and the capacitor 32. For example, the thickness of the second portion is preferably ⅓ to ½ the thickness of the first portion.

The above structure is covered with an insulating hydrogen-barrier film 120. The insulating hydrogen-barrier film 120 prevents diffusion of hydrogen into the capacitors 31 and 32, and has a higher barrier ability against hydrogen than that of the silicon oxide films used as the interlayer insulating films. An aluminum oxide ($Al_2O_3$: alumina) film is used as the insulating hydrogen-barrier film 120. The insulating hydrogen-barrier film 120 and the conductive hydrogen-barrier film 114 cover the perimeters of the capacitors 31 and 32, and prevent diffusion of hydrogen into the capacitors 31 and 32.

An interlayer insulating film 121 is formed around the insulating hydrogen-barrier film 120. Further, via plugs 122 connected to the respective top electrode 117 are formed in respective via holes piercing the aluminum oxide films 118, the silicon oxide films 119, the insulating hydrogen-barrier film 120 and the interlayer insulating film 121. The via plugs 122 are connected with respective wire 123. Aluminum or tungsten is used for the via plugs 122 and the wire 123.

As described above, according to the embodiment, the conductive hydrogen-barrier film 114 has a hydrogen diffusion preventing function which prevents diffusion of hydrogen into the capacitors 31 and 32, and a wire (interconnect) function of connecting the bottom electrodes 115 of the capacitors 31 and 32. Since the conductive hydrogen-barrier film 114 has both the hydrogen diffusion preventing function and the wire function like this, it is unnecessary to provide a hydrogen-barrier film and wire separately. This simplifies the structure and the manufacturing process, and enables realization of an effective structure having a function of preventing diffusion of hydrogen into the adjacent capacitors 31 and 32.

Further, in the conductive hydrogen-barrier film 114 of the embodiment, a portion (second portion) which interposes neither between the insulating region 20 and the capacitor 31 nor between the insulating region 20 and the capacitor 32 is thinner than a portion (first portion) which interposes between the insulating region 20 and the capacitor 31 and between the insulating region 20 and the capacitor 32. Supposing that the first portion and the second portion have the same thickness, the boundary between the conductive hydrogen-barrier film 114 and the bottom electrode 115 is aligned with the boundary between the conductive-hydrogen-barrier film 114 and the insulating hydrogen-barrier film 120. Generally, diffusion greatly progresses in a boundary. Therefore, hydrogen easily diffuses along the boundary, and the diffused hydrogen easily intrudes into the dielectric film 116 through the bottom electrode 115. This deteriorates the property of the capacitor. In this embodiment, the second portion is thinner than the first portion. Therefore, the boundary between the conductive hydrogen-barrier film 114 and the bottom electrode 115 of the capacitor is securely covered with the insulating hydrogen-barrier film 120, and diffusion of hydrogen into the capacitor is effectively prevented.

Further, in this embodiment, the conductive hydrogen-barrier film 114 also has an oxygen-barrier ability which prevents diffusion of oxygen, and thus can prevent oxidation of the tungsten plug 112. If the tungsten plug 112 is oxidized, electric connection between the transistor 10 and the capacitors 31 and 32 deteriorates, and a normal operation may be impeded. According to this embodiment, the conductive hydrogen-barrier film 114 can effectively prevent oxidation of the tungsten plug 112.

Next, a method of manufacturing a semiconductor device (ferroelectric memory) according to this embodiment is explained with reference to FIGS. 1 to 4.

First, as shown in FIG. 1, a groove is formed in the surface of the silicon substrate 100, and the groove is filled with a silicon oxide film to form an STI type isolating region (not shown). Next, the MIS transistor for performing switching operation is formed as follows. First, a silicon oxide film (gate insulating film 102) having an about 6 nm thickness is formed on the whole surface by thermal oxidation. Then, the polysilicon film 104 doped with arsenic, the tungsten silicide ($WSi_x$) film 105 and the silicon nitride film (gate cap film) 106 are successively formed. Thereafter, the polysilicon film 104, the tungsten silicide film 105 and the silicon nitride film 106 are processed by photolithography and RIE to form a gate electrode. Further, a silicon nitride film is deposited, and processed by RIE to form the gate side wall films 103 on the side walls of the gate electrode. Although a detailed explanation thereof is omitted herein, in this step, the source/drain diffusion layers 101 are formed by ion implantation and the like.

Next, a CVD oxide film serving as the interlayer insulating film 107 is deposited on the whole surface, and the CVD oxide film is planarized by CMP (chemical mechanical polishing). Then, a contact hole reaching one of the source/drain diffusion layers 101 is formed in the interlayer insulating film 107. Thereafter, an $n^+$ polysilicon film is deposited on the whole surface by CVD, and the $n^+$ polysilicon film other than that in the contact hole is removed by CMP. Thereby, the polysilicon plug 108 formed of the $n^+$ polysilicon film is formed in the contact hole. Thereafter, a CVD oxide film serving as the interlayer insulating film 109 is deposited on the whole surface, and a CVD nitride film serving as the interlayer insulating film 110 is deposited. Next, a contact hole is formed to pierce the interlayer insulating films 109 and 110. Further, the barrier metal film 111 and the tungsten plug 112 are formed in this contact hole.

Next, a CVD oxide film serving as the interlayer insulating film 113 is deposited on the whole surface, and a groove is formed in the interlayer insulating film 113 by photolithography and RIE. In this step, the interlayer insulating film 110 formed of the silicon nitride film functions as etching stopper. Then, a TiAlN film (conductive hydrogen-barrier film 114) is deposited on the whole surface by sputtering.

Figure 2:
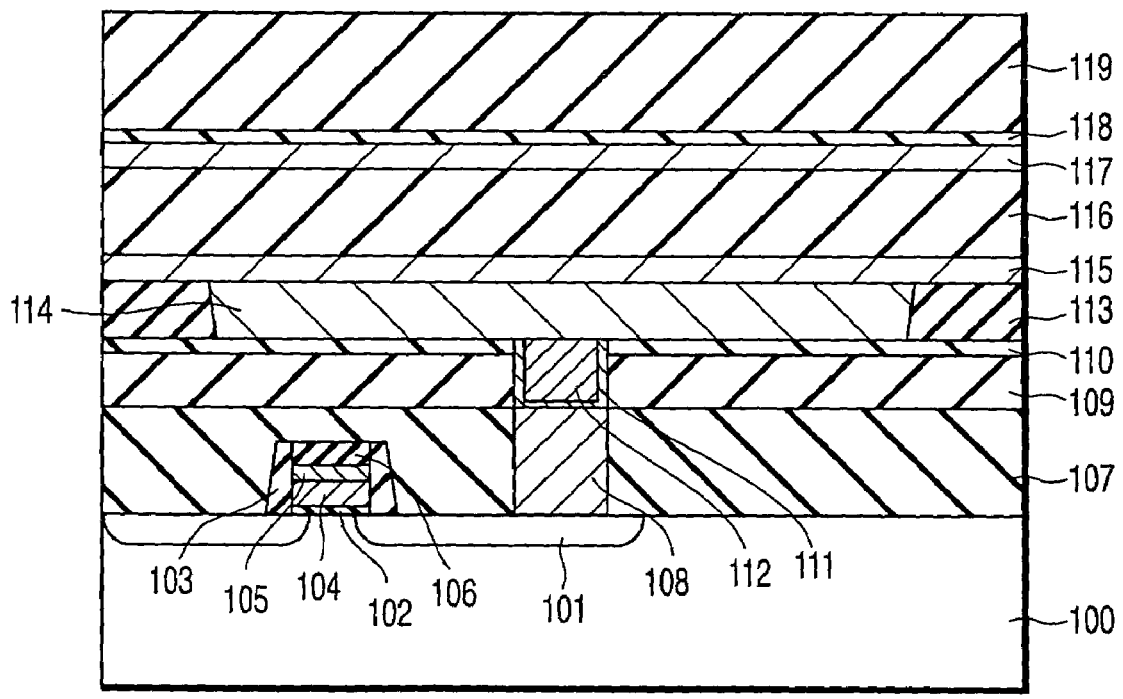
FIG. 2 is a schematic cross-sectional view of a manufacturing step of the semiconductor device according the embodiment of the present invention.

Next, as shown in FIG. 2, the TiAlN film 114 outside the groove is removed by CMP, leaving the TiAlN film 114 in the groove. Thereby, wire formed of the TiAlN film 114 (conductive hydrogen-barrier film) is formed in the groove.

Next, an Ir film, an $IrO_2$ film, a Pt film, a Ti film and an $SrRuO_3$ film (SRO film) are successively formed as a bottom electrode film 115 for the capacitors. Then, a $Pb(Zr_xTi_{1-x})O_3$ film (PZT film) is formed as the dielectric film (ferroelectric film) 116 for the capacitors. Further, an SRO film and a Pt film are successively formed as a top electrode film 117 for the capacitors. Sputtering, CVD or sol-gel method is used for formation of the bottom electrode film 115, the dielectric film 116 and the top electrode film 117. The PZT film is preferably crystallized by RTA (rapid thermal annealing) in an oxygen atmosphere. Thereafter, an aluminum oxide film 118 and a silicon oxide film 119 are formed successively. The aluminum oxide film 118 and the silicon oxide film 119 are used as hard mask in processing the top electrode film 117, the dielectric film 116 and the bottom electrode film 115 by RIE.

Figure 3:
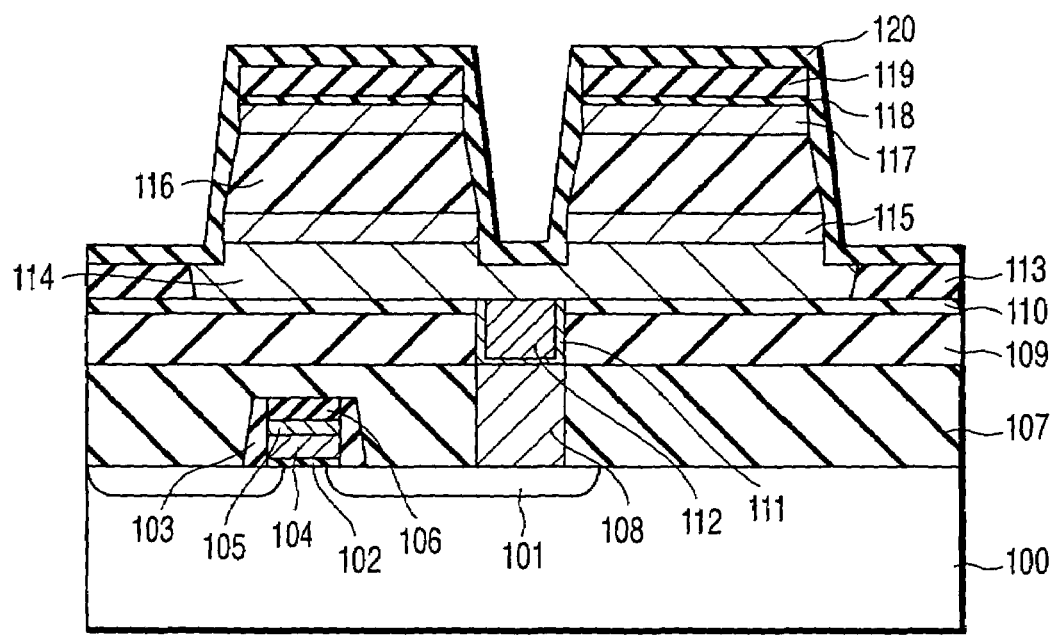
FIG. 3 is a schematic cross-sectional view of a manufacturing step of the semiconductor device according the embodiment of the present invention.

Next, as shown in FIG. 3, the aluminum oxide film 118 and the silicon oxide film 119 are subjected to patterning by photolithography and RIE. Then, with the patterned aluminum oxide film 118 and the silicon oxide film 119 used as hard mask, the top electrode film 117, the dielectric film 116 and the bottom electrode film 115 are patterned by RIE. In this patterning, an exposed portion of the conductive hydrogen-barrier film 114 is also etched and thinned to a certain extent.

Thereafter, an aluminum oxide ($Al_2O_3$: alumina) film is formed as the insulating hydrogen-barrier film 120, and the capacitor structure is covered with the insulating hydrogen-barrier film 120. The aluminum oxide film 120 is formed by ALD (atomic layer deposition). Depositing the aluminum oxide film by ALD enables formation of the insulating hydrogen-barrier film 120 having excellent hydrogen-barrier ability.

Figure 4:
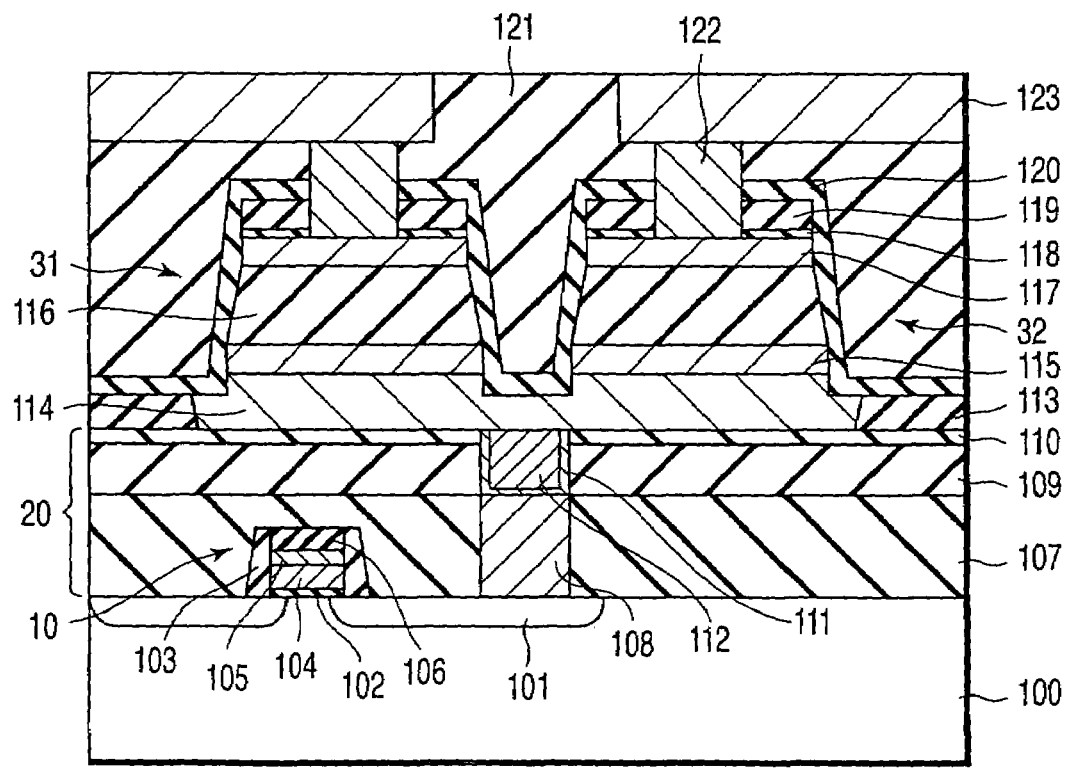
FIG. 4 is a schematic cross-sectional view of a manufacturing step of the semiconductor device according the embodiment of the present invention.

Next, as shown in FIG. 4, a CVD oxide film serving as the interlayer insulating film 121 is deposited on the whole surface. Then, to remove the damage which occurred in the PZT film 114 in processing the capacitors, the structure is subjected to heat treatment in an oxygen atmosphere. Further, the interlayer insulating film 121 is planarized by CMP. Thereafter, via holes and grooves for wires are formed by photolithography and RIE. Then, a barrier metal film (for example, a stacked structure of TiN and Ti) and aluminum film (or tungsten film) are deposited and planarized by CMP to form the via plugs 122 and the wire 123 in the via holes and the grooves for wires.

Thereafter, drive lines and bit lines are formed, and further upper layer metal wires are formed, although they are not shown.

As described above, as shown in FIG. 4, obtained is a ferroelectric memory having a structure in which the capacitors 31 and 32 are surrounded by the conductive hydrogen-barrier film 114 and the insulating hydrogen-barrier film 120.

In the above embodiment, a film containing titanium, aluminum and nitrogen (TiAlN film) is used as the conductive hydrogen-barrier film 114. However, a film containing titanium, silicon and nitrogen (TiSiN film), a film containing tantalum, aluminum and nitrogen (TaAlN film), or a film containing tantalum, silicon and nitrogen (TaSiN film) may be used as the conductive hydrogen-barrier film 114. Generally, the conductive hydrogen-barrier film 114 preferably contains a predetermined metallic element (in particular, Ti or Ta) and nitrogen.

Further, in the above embodiment, although a $Pb(Zr_xTi_{1-x})O_3$ film (PZT film) is used as the dielectric films 116 of the capacitors 31 and 32, an SBT film ($SrBi_2Ta_2O_9$ film) or the like may be used. Generally, the dielectric film 116 preferably includes a ferroelectric film formed of metal oxide.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate;
an insulating region provided on the semiconductor substrate;
a first capacitor provided above the insulating region;
a second capacitor provided above the insulating region and adjacent to the first capacitor;
a conductive hydrogen-barrier film which prevents diffusion of hydrogen into the first and second capacitors and connects a bottom electrode of the first capacitor with a bottom electrode of the second capacitor, the conductive hydrogen-barrier film having a first portion interposing between the insulating region and the first capacitor and between the insulating region and the second capacitor;
a first wire connected to a top electrode of the first capacitor; and
a second wire connected to a top electrode of the second capacitor.

2. The semiconductor device according to claim 1, wherein
the conductive hydrogen-barrier film has a second portion interposing neither between the insulating region and the first capacitor nor between the insulating region and the second capacitor, the second portion being thinner than the first portion.

3. The semiconductor device according to claim 2, further comprising:
an insulating hydrogen-barrier film which prevents diffusion of hydrogen into the first and second capacitors, and covers the first capacitor, the second capacitor and the second portion of the conductive hydrogen-barrier film.

4. The semiconductor device according to claim 3, wherein
the insulating hydrogen-barrier film includes an aluminum oxide film.

5. The semiconductor device according to claim 4, wherein
the aluminum oxide film is formed by ALD.

6. The semiconductor device according to claim 1, wherein
the conductive hydrogen-barrier film has an oxygen-barrier ability to prevent diffusion of oxygen.

7. The semiconductor device according to claim 1, wherein
the insulating region includes a plug connected to the conductive hydrogen-barrier film.

8. The semiconductor device according to claim 7, wherein
the conductive hydrogen-barrier film has an oxygen-barrier ability to prevent diffusion of oxygen.

9. The semiconductor device according to claim 7, further comprising:
a transistor provided on a surface region of the semiconductor substrate, and electrically connected to the plug.

10. The semiconductor device according to claim 1, wherein
the conductive hydrogen-barrier film contains a predetermined metallic element and nitrogen.

11. The semiconductor device according to claim 1, wherein
the conductive hydrogen-barrier film is selected from a film containing titanium, aluminum and nitrogen, a film containing titanium, silicon and nitrogen, a film containing tantalum, aluminum and nitrogen, and a film containing tantalum, silicon and nitrogen.

12. The semiconductor device according to claim 1, wherein
a dielectric film of each of the first and second capacitors includes a ferroelectric film formed of a metal oxide.

13. A semiconductor device comprising:
a semiconductor substrate;
an insulating region provided on the semiconductor substrate;
a first capacitor provided above the insulating region;
a second capacitor provided above the insulating region and adjacent to the first capacitor;
a conductive hydrogen-barrier film which prevents diffusion of hydrogen into the first and second capacitors and connects a bottom electrode of the first capacitor with a bottom electrode of the second capacitor, the conductive hydrogen-barrier film having a first portion interposing between the insulating region and the first capacitor and between the insulating region and the second capacitor;
a first wire connected to a top electrode of the first capacitor; and
a second wire connected to a top electrode of the second capacitor; wherein
the conductive hydrogen-barrier film has a second portion interposing neither between the insulating region and the first capacitor nor between the insulating region and the second capacitor, the second portion being thinner than the first portion.

14. The semiconductor device according to claim 13, further comprising:
an insulating hydrogen-barrier film which prevents diffusion of hydrogen into the first and second capacitors, and covers the first capacitor, the second capacitor and the second portion of the conductive hydrogen-barrier film.

15. The semiconductor device according to claim 14, wherein
the insulating hydrogen-barrier film includes an aluminum oxide film.

16. The semiconductor device according to claim 15, wherein
the aluminum oxide film is formed by ALD.

* * * * *